US009177990B2

(12) United States Patent
Tomita et al.

(10) Patent No.: US 9,177,990 B2
(45) Date of Patent: Nov. 3, 2015

(54) METHOD FOR FORMING IMPURITY LAYER, EXPOSURE MASK THEREFORE AND METHOD FOR PRODUCING SOLID-STATE IMAGING DEVICE

(75) Inventors: Ken Tomita, Iwate-ken (JP); Yoshihiro Obara, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 968 days.

(21) Appl. No.: 13/225,846

(22) Filed: Sep. 6, 2011

(65) Prior Publication Data

US 2012/0077304 A1    Mar. 29, 2012

(30) Foreign Application Priority Data

Sep. 21, 2010    (JP) ................. 2010-210930

(51) Int. Cl.
*H01L 31/18* (2006.01)
*H01L 21/22* (2006.01)
*H01L 27/146* (2006.01)
*G03F 1/28* (2012.01)

(52) U.S. Cl.
CPC ............ *H01L 27/14683* (2013.01); *G03F 1/28* (2013.01)

(58) Field of Classification Search
None
See application file for complete search history.

(56) References Cited

U.S. PATENT DOCUMENTS

| 7,838,344 | B2 | 11/2010 | Sekine et al. |
| 2009/0181501 | A1 | 7/2009 | Sekine et al. |
| 2010/0133420 | A1 | 6/2010 | Ogino |
| 2010/0177231 | A1 | 7/2010 | Tsuchida |

FOREIGN PATENT DOCUMENTS

| EP | 0 731 387 A2 | 9/1996 |
| JP | 2009-170653 | 7/2009 |
| TW | 320778 | 11/1997 |
| TW | 200841462 A | 10/2008 |
| TW | 200933709 A | 8/2009 |
| TW | 201030948 A1 | 8/2010 |

OTHER PUBLICATIONS

Chinese Office Action issued Jul. 10, 2014, in China Patent Application No. 201110282163.X (with English translation).
Office Action issued Dec. 4, 2013, in Chinese Patent Application No. 201110282163.X with English translation.
Combined Office Action and Search Report issued Dec. 26, 2013 in Taiwanese Patent Application No. 100132448 (with English language translation).

*Primary Examiner* — Seahvosh Nikmanesh
(74) *Attorney, Agent, or Firm* — Oblon, McClelland, Maier & Neustadt, L.L.P.

(57) ABSTRACT

A method for forming an impurity layer, includes forming a resist material 16 on a surface portion of a semiconductor substrate 15; exposing the resist material using a grating mask 10 comprising a light transmission region 11 including a plurality of unit light transmission regions 14 being arranged two-dimensionally, each being composed of a plurality of minute partial sections 13A to 13D having different transmittance; forming a resist layer 18 on the surface of the semiconductor substrate 15 by developing the exposed resist material, the resist layer including a thin film region 17 having a film thickness corresponding to the transmittance of the light transmission region; implanting ions to the semiconductor substrate 15 via the thin film region; and diffusing ion groups 21A', 21B', 21C', and 21D' that are implanted at the same depth such that the ion groups are coupled in a lateral direction.

26 Claims, 18 Drawing Sheets

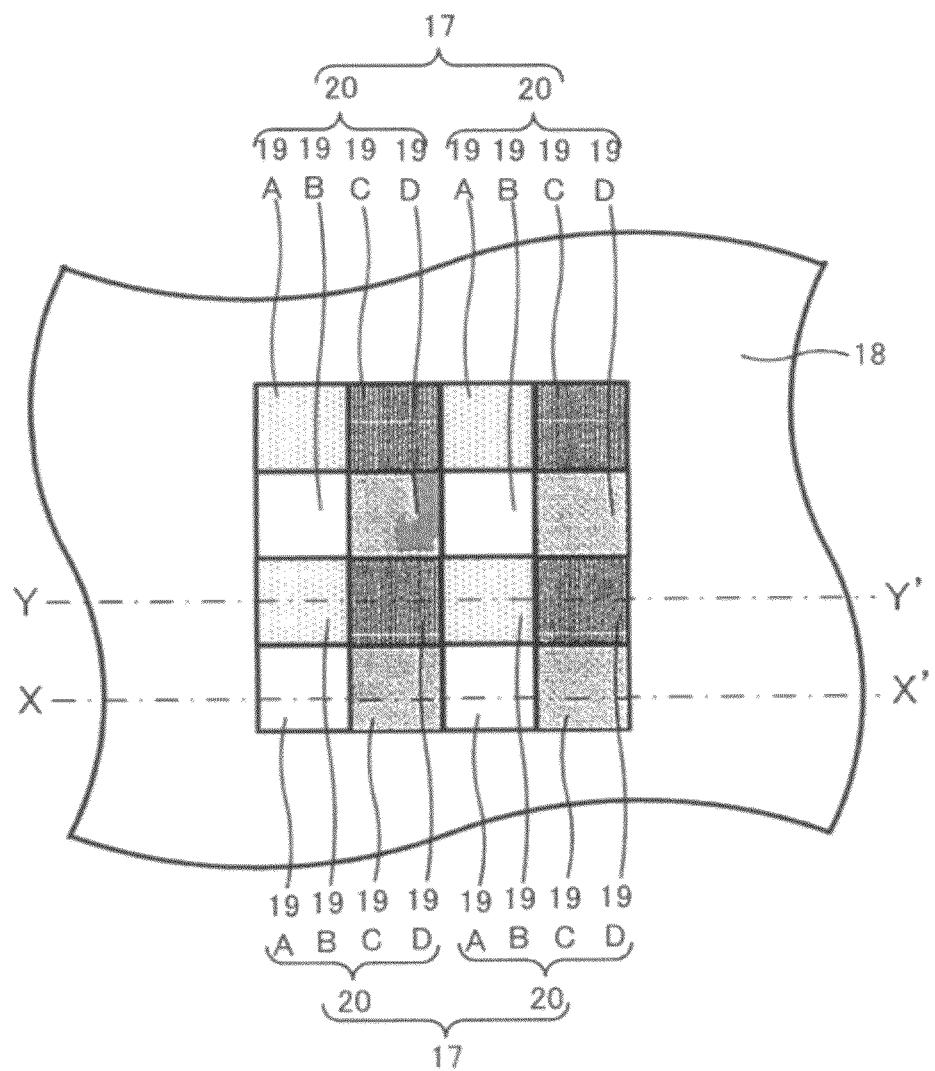

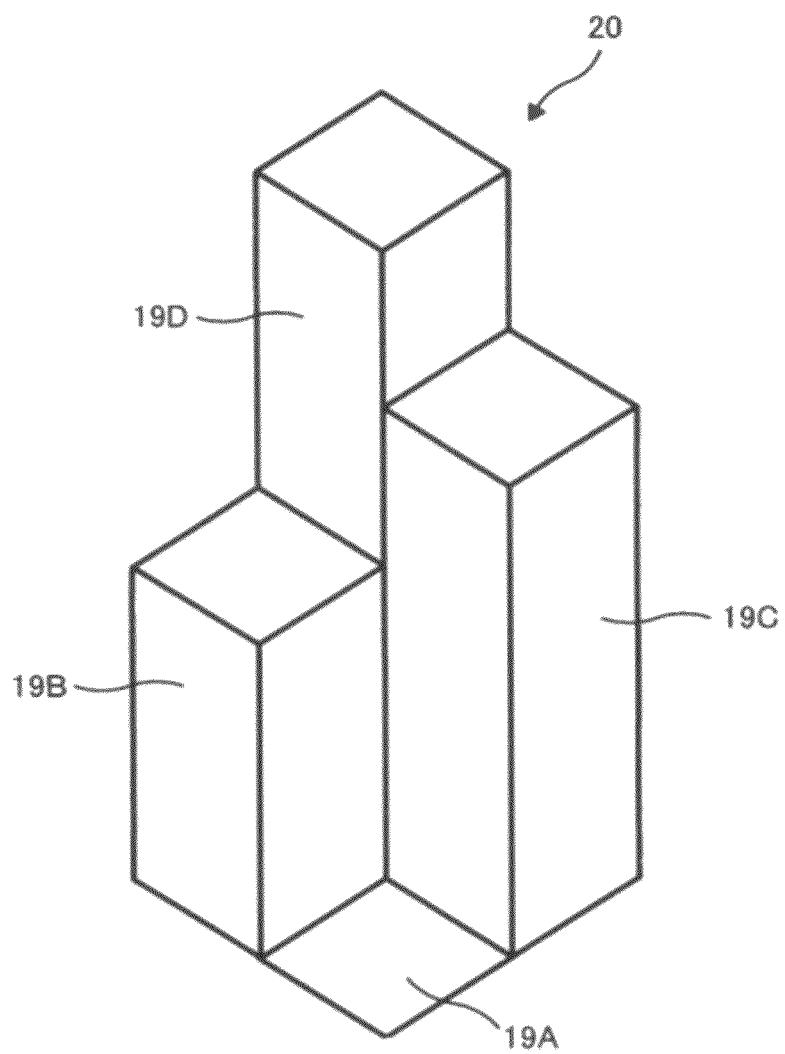

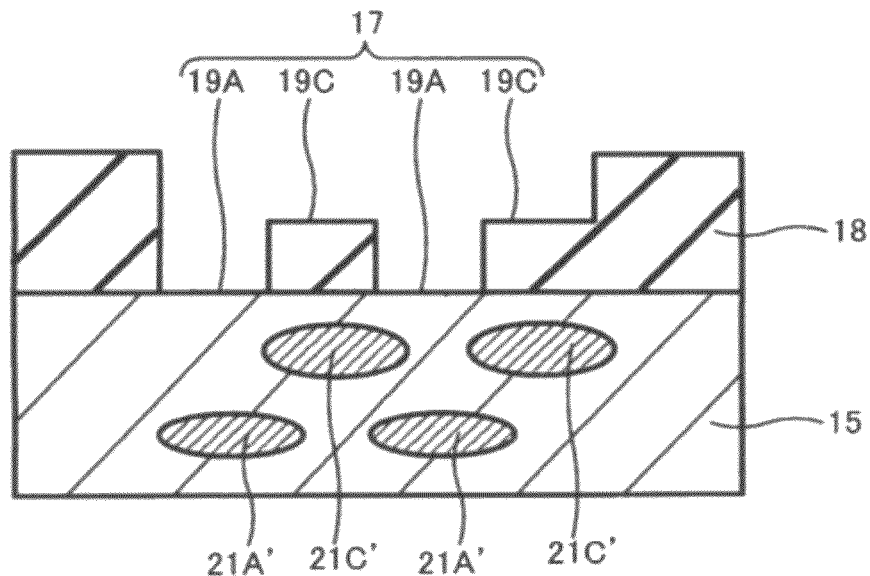
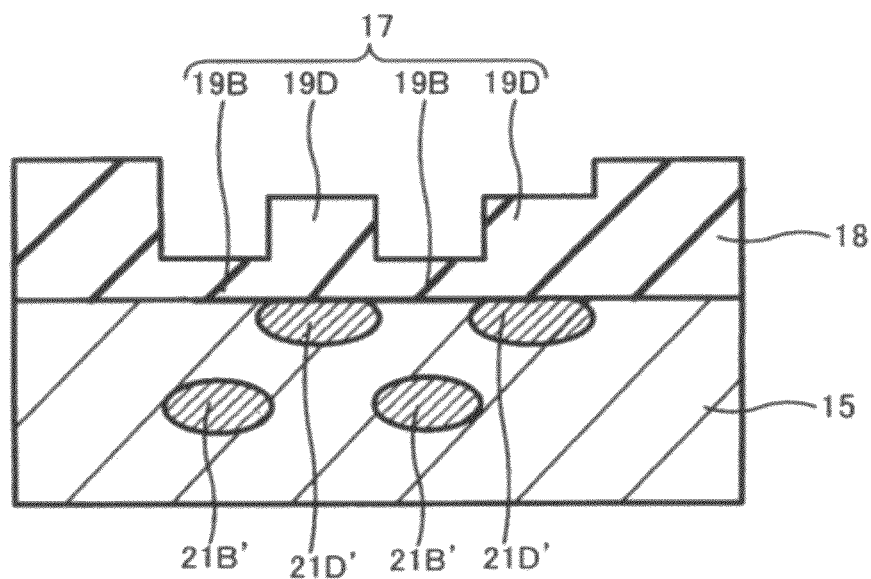

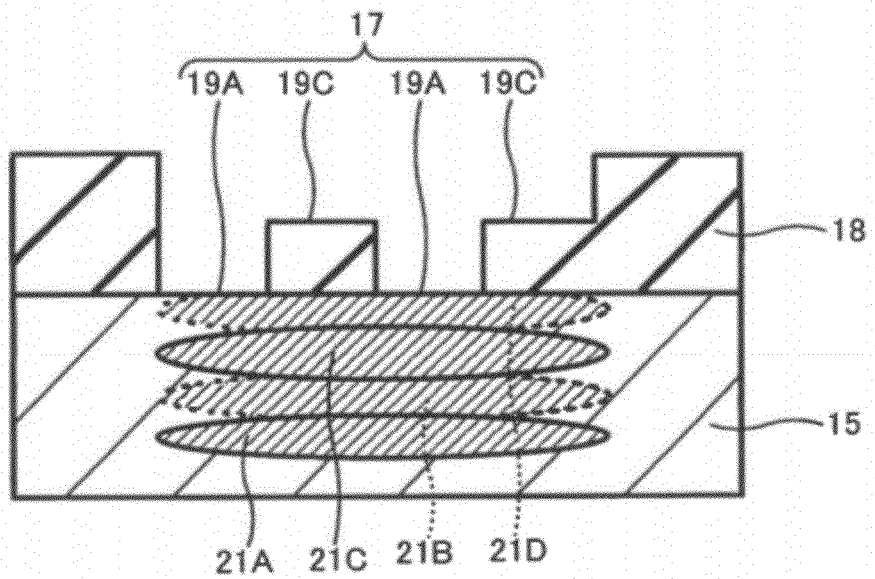
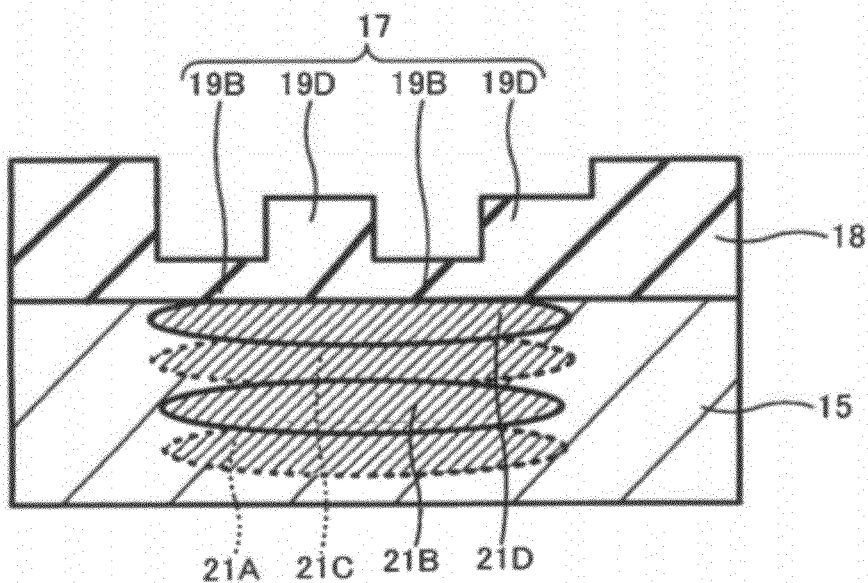

METHOD FOR FORMING IMPURITY LAYER, EXPOSURE MASK THEREFORE AND METHOD FOR PRODUCING SOLID-STATE IMAGING DEVICE

CROSS REFERENCE TO RELATED APPLICATIONS

This application is based upon and claims the benefit of priority from the prior Japanese Patent Application No. 2010-210930 filed in Japan on Sep. 21, 2010; the entire contents of which are incorporated herein by reference.

FIELD

Embodiments described herein relate generally to a method for forming an impurity layer, an exposure mask therefore and a method for producing a solid-state imaging device.

BACKGROUND

In general, a semiconductor device having a deep impurity layer is known. For example, a pixel isolation layer in a CMOS sensor and a well layer in a CCD sensor are impurity layers that need to be formed at least deeper than a photoelectric conversion section.

The deep impurity layers such as the pixel isolation layer and the well layer, etc. are formed by plural times of ion implantations while changing an acceleration voltage of ions, and thereby creating a plurality of density peaks in a depth direction. Alternatively, it may be formed by diffusing the ions in the depth direction by a thermal diffusion over a long period of time after having performed the ion implantation once.

As aforementioned, conventionally, it is difficult to form such a deep impurity layer in a short period of time since the deep impurity layer has been formed by the plural times of the ion implantation steps or the time-consuming thermal diffusion step. Accordingly, in a case of a solid-state imaging device such as the CMOS sensor, the CCD sensor, etc., a long period of time is required to form the pixel isolation layer or the well layer, and this has been a cause of an obstruction to an improvement of a throughput in producing the solid-state imaging device.

It is one of the objects of an embodiment of the present invention to provide a method for forming a deep impurity layer extending from a surface toward a depth direction can be formed in a short period of time, to provide an exposure mask therefore and to provide a method for producing a solid-state imaging device by which a throughput can be improved.

BRIEF DESCRIPTION OF THE DRAWINGS

FIG. 3(a) is a cross sectional view along a dashed line X-X' in FIG. 2 that shows a step of exposing a resist material using the grating mask, and FIG. 3(b) is a cross sectional view along a dashed line Y-Y' in FIG. 2 that shows the same step.

FIG. 4 is a top view showing a step of forming a resist layer having a thin film region on the semiconductor substrate according to the embodiment of the present invention.

FIG. 5(a) is a cross sectional view along a dashed line X-X' in FIG. 4, and FIG. 5(b) is a cross sectional view along a dashed line Y-Y' in FIG. 4.

FIG. 6 is a perspective enlarged view showing a part of the thin film region in the resist layer.

FIGS. 7(a) and 7(b) are diagrams for explaining the method for forming the impurity layer of the embodiment of the present invention, where FIG. 7(a) is a cross sectional view corresponding to FIG. 5(a) showing a step of forming the impurity layer, and FIG. 7(b) is a cross sectional view corresponding to FIG. 5(b) showing the same step.

FIGS. 8(a) and 8(b) are diagrams for explaining the method for forming the impurity layer of the embodiment of the present invention, where FIG. 8(a) is similarly a cross sectional view corresponding to FIG. 5(a) showing the step of forming the impurity layer, and FIG. 8(b) is a cross sectional view corresponding to FIG. 5(b) showing the same step.

FIG. 9(a) is similarly a cross sectional view corresponding to FIG. 5(a) showing the step of forming the impurity layer, and FIG. 9(b) is a cross sectional view corresponding to FIG. 5(b) showing the same step.

DETAILED DESCRIPTION

Figure 1:
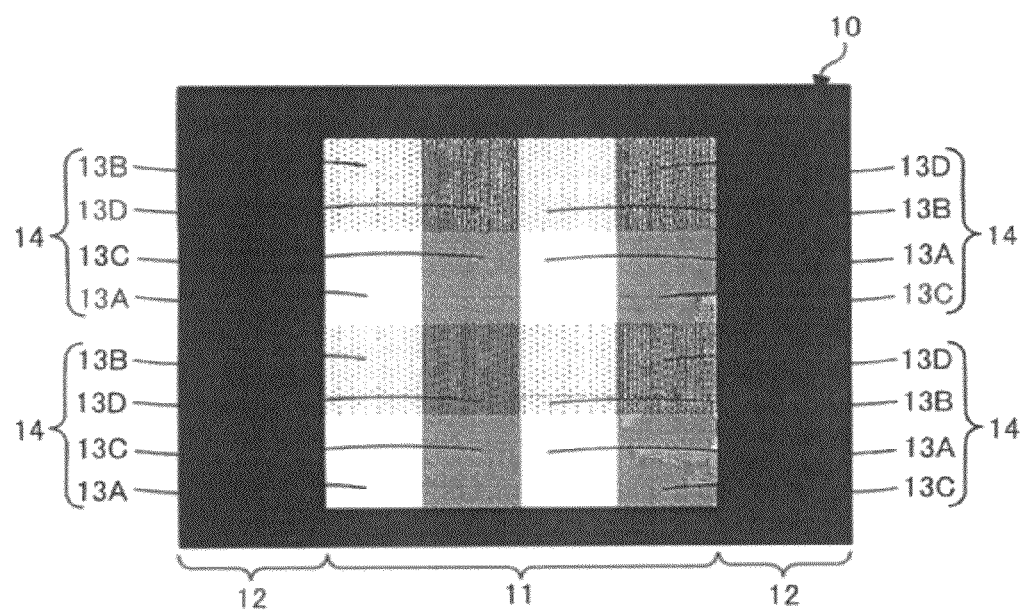
FIG. 1 is a top enlarged view showing a part of a grating mask used in a method for forming an impurity layer according to an embodiment of the present invention.

A method for forming an impurity layer according to an embodiment of the present invention includes: forming a photosensitive resist material on a substrate; exposing the resist material using an exposure mask in which a plurality of unit light transmission regions is arranged two-dimensionally, each unit light transmission region being composed of a plurality of partial regions having different transmittance; forming a resist layer in which a film thickness is made partially different according to the transmittance of the exposure mask by developing the exposed resist material; implanting ions to the substrate via the resist layer; and diffusing ion groups that are implanted via resist layer portions having same film thickness such that the ion groups are coupled in a lateral direction and are uniformly distributed.

Further, a method for producing a solid-state imaging device according to an embodiment of the present invention includes: arranging a plurality of photoelectric conversion sections in a matrix on a surface of a base layer formed on a surface of a semiconductor substrate; forming a photosensitive resist material on a surface of the base layer including the photoelectric conversion sections; positioning an exposure mask composed of a plurality of non-light transmission regions arranged in a matrix and light transmission regions arranged between non-light transmission regions such that each of the non-light transmission regions of the exposure mask is positioned above the plurality of photoelectric conversion sections, wherein each of the light transmission regions includes a plurality of unit light transmission regions being arranged two-dimensionally, and each unit light transmission region being composed of a plurality of partial regions having different transmittance; exposing the resist material using the exposure mask; forming a resist layer in which a film thickness is made partially different according to the transmittance of the exposure mask by developing the exposed resist material; implanting ions to intervals between the photoelectric conversion sections in the base layer via the resist layer; and forming a pixel isolation layer by diffusing ion groups that are implanted via parts having same film thickness such that the ion groups are coupled in a lateral direction and are uniformly distributed.

Further, a method for producing a solid-state imaging device according to an embodiment of the present invention includes: forming a photosensitive resist material on a surface of a semiconductor substrate; exposing the resist material using an exposure mask composed of a light transmission region and a non-light transmission region surrounding the light transmission region, the light transmission region including a plurality of unit light transmission regions being arranged two-dimensionally, and each unit light transmission region being composed of a plurality of partial regions having different transmittance; forming a resist layer in which a film thickness is made partially different according to the transmittance of the exposure mask by developing the exposed resist material; implanting ions to the silicon substrate via the resist layer; forming a well layer by diffusing ion groups that are implanted at a substantially same depth in the semiconductor substrate such that the ion groups are coupled in a lateral direction and are uniformly distributed; and forming a plurality of photoelectric conversion sections with an alignment of a matrix on a surface of the well layer.

Further, the exposure mask of an embodiment of the present invention includes a light transmission region used for the aforementioned method for forming the impurity layer, and the light transmission region is composed of a plurality of unit light transmission regions each composed of a plurality of partial regions having different transmittance, and the unit light transmission regions are arranged in a column direction or a row direction.

First, a grating mask used in a method for forming an impurity layer according to the embodiment of the present invention will be explained with reference to FIG. 1. FIG. 1 is an enlarged top view showing a part of the grating mask used in the method. The grating mask 10 shown in FIG. 1 has a light transmission region 11 having different transmittance depending on positions therein and is surrounded by a non-light transmission region 12 having substantially 0% transmittance.

The light transmission region 11 of the grating mask 10 has a plurality of unit light transmission region 14 as a basic unit of the light transmission region 11, and the unit light transmission regions 14 are arranged two-dimensionally with no space among them.

Each unit light transmission region 14 is divided into four partial region 13A, 13B, 13C and 13D arranged in a matrix each having a square region having a minute area. Each of a first to a fourth partial region 13A, 13B, 13C and 13D has different light transmittance from one another, which decreases in this order. That is, the first partial region 13A has the highest light transmittance, the second partial region 13B has second highest light transmittance, the third partial region 13C has light transmittance lower than that of the second partial region and the fourth partial region 13D has the lowest light transmittance.

As explained above, a plurality of the unit light transmission regions 14 is arranged two-dimensionally with no space between any adjacent unit light transmission regions so that a plurality of corresponding partial regions having the same transmittance 13A, 13B, 13C or 13D composing a plurality of the unit light transmission regions 14 are arranged in a checker pattern being apart from one another. That is, the first light transmission partial regions 13A composing a plurality of the unit light transmission regions 14 are arranged in a checker pattern being apart from one another. Similarly, the second, third and fourth light transmission partial regions 13B, 13C or 13D composing a plurality of the unit light transmission regions 14 are arranged in a checker pattern being apart from one another, respectively.

However, the partial regions 13A, 13B, 13C and 13D having the same transmittance may not necessarily be arranged apart from one another.

The grating mask 10 described above has a dot pattern composed of a chromium film that reflects exposure light appropriately formed on a surface of a transparent substrate, e.g. a glass plate, etc., through which the exposure light transmits. In this grating mask 10, the transmittance of the exposure light is controlled by a size of the dot pattern, when a number of the dot patterns included in each partial region is equal. Accordingly, the size of the dot patterns in the light transmission partial regions 13A, 13B, 13C, and 13D increases in this order. However, it is noted that, the transmittance of the exposure light of the respective light transmission partial regions 13A, 13B, 13C and 13D may be controlled by density of the dot pattern, when the size of the dot patterns are equal to each other.

Figure 2:
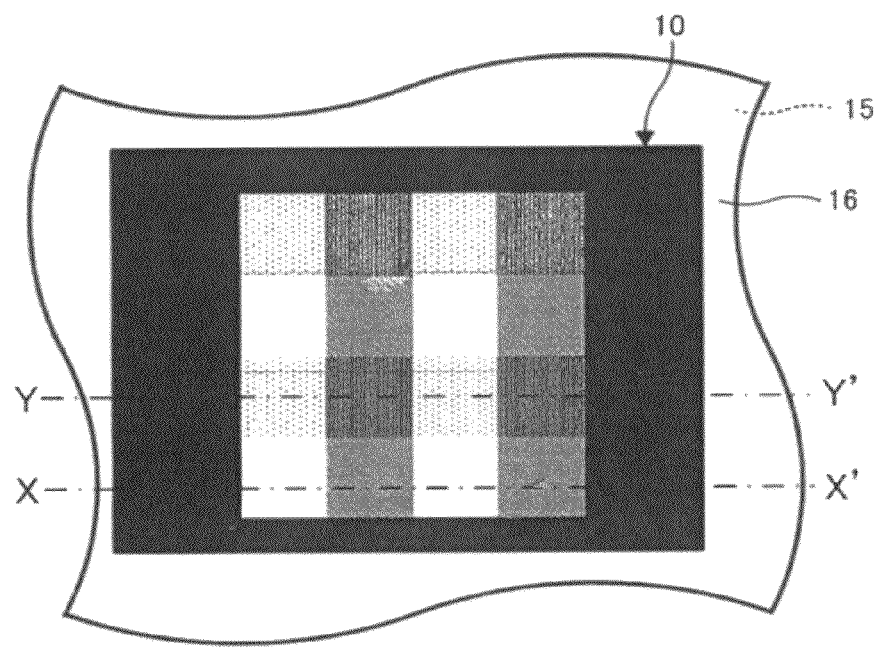
FIG. 2 is a top view showing a step of arranging the grating mask on a semiconductor substrate according to the method for forming the impurity layer of the embodiment.

Next, a method for forming an impurity layer using this grating mask 10 will be explained with reference to FIG. 2 to FIG. 9. First, processes for forming a resist layer using the grating mask 10 shown in FIG. 1 will be explained with reference to FIG. 2 to FIG. 6. FIG. 2 is a top view of the impurity layer to be formed with the method of the embodiment.

A resist material 16 is formed uniformly on a surface of the semiconductor substrate 15, and the grating mask 10 shown in FIG. 1 is placed on the resist material 16 as shown in FIG. 2.

Figure 3A:
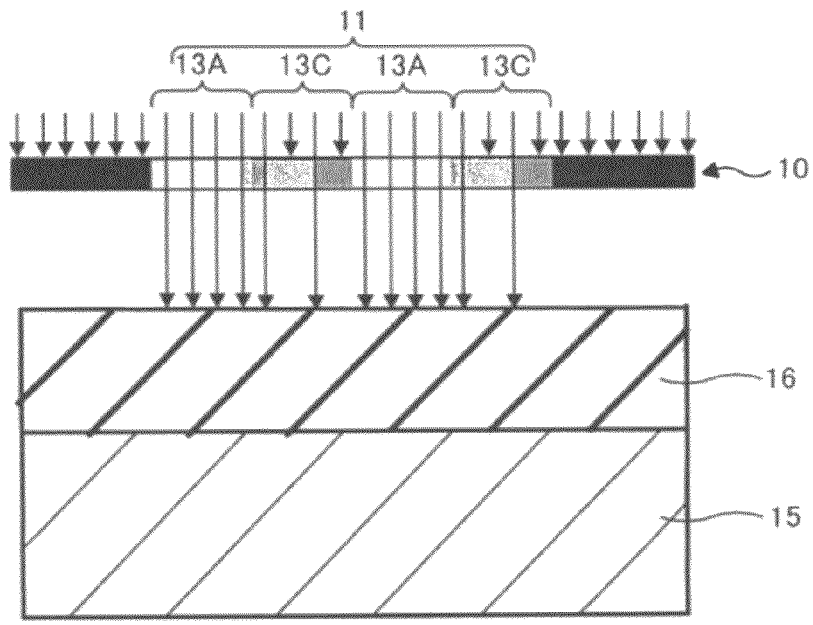
FIGS. 3(a) and 3(b) are diagrams for explaining the method for forming the impurity layer of the embodiment of the present invention, where
Figure 3B:
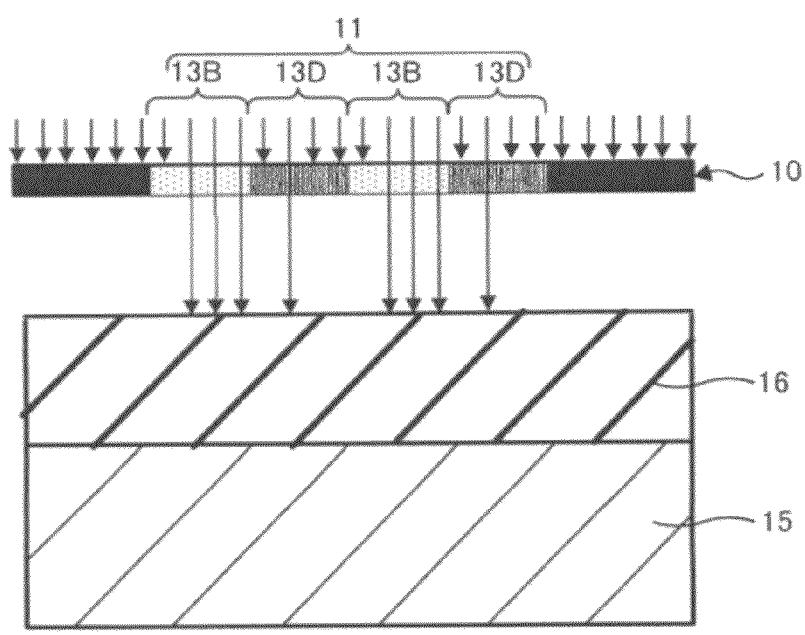

FIGS. 3(a) and 3(b) are diagrams for explaining the method for forming the impurity layer of the embodiment of the present invention, where FIG. 3(a) is a cross sectional view along a dashed line X-X' in FIG. 2 that shows a step of exposing a resist material using the grating mask, and FIG. 3(b) is a cross sectional view along a dashed line Y-Y' in FIG. 2 that shows the same step. As shown in FIGS. 3(a) and 3(b), the resist material 16 is then exposed using the grating mask 10. Thus, the resist material 16 under the light transmission region 11 of the grating mask 10 is exposed at an amount of exposure light corresponding to the transmittance of the light transmission region 11.

That is, as shown in FIG. 3(a), the largest amount of exposure light is irradiated onto the resist material 16 under the first light transmission partial region 13A. On the other hand, as shown in FIG. 3(b), the smallest amount of exposure light is irradiated onto the resist material 16 under the fourth light transmission partial region 13D. Accordingly, the higher the transmittance of the light transmission partial region is, the larger the amount of exposure light is irradiated onto the resist material 16 under the light transmission partial region with higher transmittance.

Figure 5:
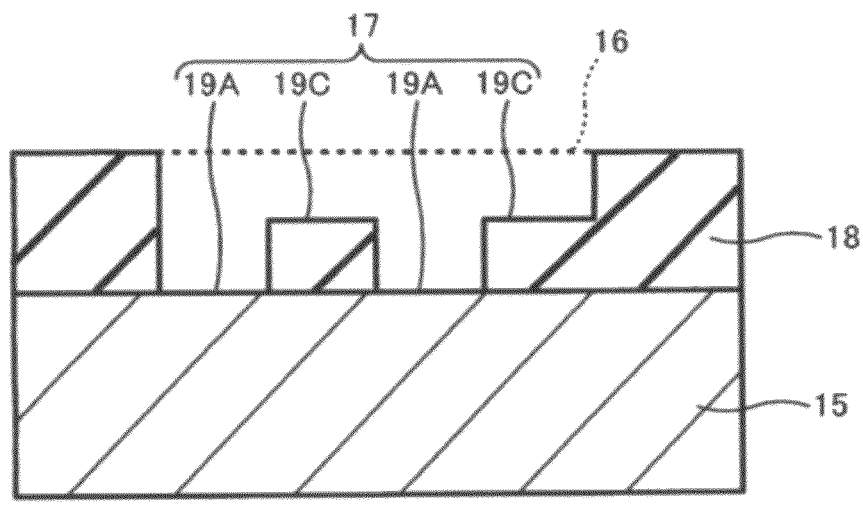
FIG. 5 are cross sectional views of FIG. 4, where
Figure 5:
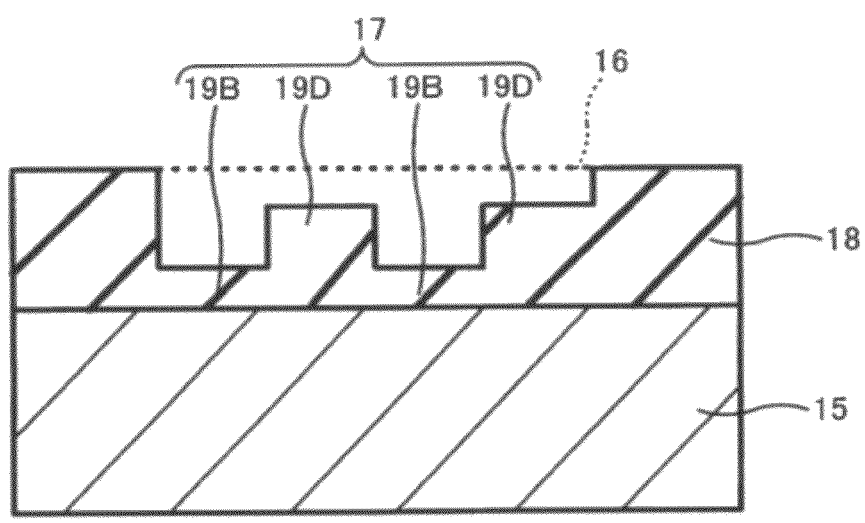

FIG. 4 is a top view of the impurity layer to be formed with the method of the embodiment and FIG. 5 are cross sectional views of FIG. 4, where FIG. 5(a) is a cross sectional view along a dashed line X-X' in FIG. 4, and FIG. 5(b) is a cross sectional view along a dashed line Y-Y' in FIG. 4. As shown in FIG. 4 and FIGS. 5A and 5B, the exposed resist material is developed. Thus, the resist material 16 is removed at a greater degree in regions with greater amount of exposure. Accordingly, on a surface of the semiconductor substrate 15, a resist layer 18 in which a film thickness is made partially different according to the transmittance of the grating mask 10. That is, a resist layer 18 including a thin film region 17 in a quilted manner in which the film thickness is made partially different according to the amount of exposure is formed.

The thin film region 17 has a resist unit 20 as a basic unit of the thin film region 17, and is a region in which a plurality of resist units 20 is arranged with no space between any adjacent units.

An inside of each of the resist units 20 is divided into four partial regions 19A, 19B, 19C and 19D arranged in a matrix such that each has a square shape of a minute area. The first to the fourth partial regions 19A, 19B, 19C and 19D has a different film thickness from one another. The film thickness of the partial regions 19A, 19B, 19C and 19D increases in this order.

Here, a further explanation regarding the resist units 20 will be given with reference to FIG. 6. FIG. 6 is a perspective view showing one of the resist units 20. As shown in FIG. 6, the resist unit has four square poles, which are formed at respective film thickness corresponding to the transmittance of the unit light transmission regions of the grating mask 10, and arranged two-dimensionally with no space between any adjacent poles. Each of the square poles has a height (film thickness) corresponding to the transmittance of the respective light transmission partial region 13A to 13D of the unit light transmission region 14. Further, an area of each square pole at its horizontal cross section is at a minute area corresponding to the minute areas of the respective light transmission partial regions 13A to 13D of the unit light transmission region 14.

Note that, in the resist unit 20 shown in FIG. 6, the film thicknesses of the respective thin film partial regions 19A to 19D are acceptable so long as they are at film thicknesses through which ions can penetrate in an ion implantation step that will be described later. Here, in the present embodiment, the thin film partial regions 19A to 19D include a case in which the film thickness is 0 μm. Accordingly, especially the first thin film partial region 19A may have the film thickness of 0 μm as shown in FIG. 6.

The thin film region 17 is a region in which the plurality of resist units 20 as explained above is arranged two-dimensionally with no space between any adjacent units, and thus, the thin film partial regions having the same film thickness, e.g. the first thin film partial regions 19A are arranged in checked pattern being apart from one another.

Next, a method for forming an impurity layer on the semiconductor substrate 15 using the resist layer 18 shown in FIG. 4 to FIG. 6 will be explained with reference to FIGS. 7(a) and 7(b) to FIGS. 9(a) and 9(b). Here, figures (a) in the respective figures are cross sectional views corresponding to FIG. 5(a), and figures (b) in the respective drawings are cross sectional views corresponding to FIG. 5(b).

As shown in FIGS. 7(a) and 7(b), p-type ions, for example, are implanted into the semiconductor substrate 15 via the resist layer 18 at a desired acceleration voltage. The implanted ions reach a desired depth in the semiconductor substrate 15 after penetrating the thin film region 17. The depth to which the ions reach depends on the film thickness of the thin film region 17, and the thinner the film thickness is, the deeper the ions reach in the substrate. Accordingly, a plurality of ion groups 21A', 21B', 21C' and 21D' is formed at depths corresponding to the film thickness of the thin film region 17.

For example, a plurality of first ion groups 21A' that is formed by the ions implanted via the corresponding thin film partial regions having the same film thickness, i.e., the first thin film partial regions 19A, is formed at the same depth as shown in FIG. 7(a) but at different positions in a lateral direction (horizontal direction). Similarly, a plurality of third ion groups 21C' that is formed by the ions implanted via the third thin film partial regions 19C is formed at the same depth that is shallower than that of the first ion groups 21A', but at different positions in the lateral (horizontal) direction.

Further as shown in FIG. 7(b), a plurality of second ion groups 21B' that is formed by the ions implanted via the second thin film partial regions 19B is formed at the same depth that is shallower than that of the first ion groups 21A' and deeper than that of the third ion groups 21C', but at different positions in the lateral direction (horizontal direction). A plurality of fourth ion groups 21D' that is formed by the ions implanted via the fourth thin film partial region 19D is formed at the same depth that is shallower than that of the third ion groups 21C', but at different positions in the lateral direction (horizontal direction).

FIG. 8(a) is a cross sectional view corresponding to FIG. 5(a) showing a process for forming the impurity layer and FIG. 8(b) is a cross sectional view corresponding to FIG. 5(b) showing the same process. As shown in FIGS. 8(a) and 8(b), diffusion of the respective ion groups 21A', 21B', 21C' and 21D' after the ion implantation is performed by applying heat, thus, a plurality of p-type impurity regions, a first impurity region 21A, a second impurity region 21B, a third impurity region 21C and a fourth impurity region 21D, is formed at different depths of the semiconductor substrate 15. The depths where each of impurity regions 21A, 21B, 21C and 21D has their respective peak density decrease in this order.

That is, the first ion groups 21A' forms the p-type first impurity region 21A at the deepest depths are so diffused as to be laterally combined with each other after the ion implantation as shown in FIG. 8(a). Similarly, the third ion groups 21C' form the p-type third impurity region 210 at the depth shallower than the first impurity region 21A by the diffusion. Here, since the ion groups 21A', 21B', 21C' and 21D' simultaneously diffuse also in a different direction in a horizontal plain at the different depth in the semiconductor substrate including a vertical direction with respect to a sheet plain of the drawing, the first and third impurity regions 21A, 21C are also formed at positions shown by dotted lines in FIG. 8(b).

The second and the fourth ion groups 21B' and 21D' form the second and fourth impurity region 21B and 21D in the same manner as shown in FIGS. 8(a) and (b).

Figure 9A:
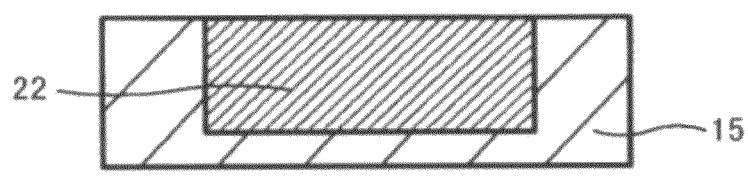
FIGS. 9(a) and 9(b) are diagrams for explaining the method for forming the impurity layer of the embodiment of the present invention, where
Figure 9B:
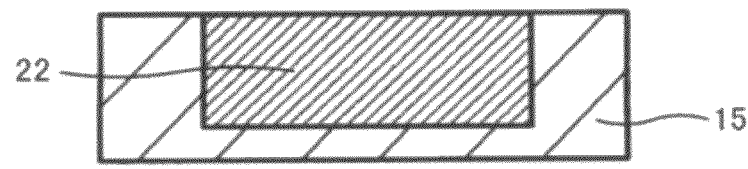

Further, since the implanted ions diffuse also in the vertical direction, the ions in the impurity regions 21A to 21D having respective peak density at different depths in the semiconductor substrate are finally distributed substantially uniformly in the vertical direction to form a deep impurity layer 22, as shown in FIGS. 9(a) and 9(b), can be formed.

Here, a further thermal treatment may be performed after the first to the fourth impurity regions 21A, 21B, 21C and 21D are formed as shown in FIGS. 8(a) and 8(b) until the ions in the impurity regions 21A to 21D having respective peak density at different depths in the semiconductor substrate are finally distributed substantially uniformly in the vertical direction to form a deep impurity layer 22, as shown in FIGS. 9(a) and 9(b), can be formed. However, since the ion implantation in the semiconductor substrate 15 is performed so that the peak densities are formed at different depths of the substrate, a time of the thermal treatment for thermally diffusing the ions can be a very short period of time.

As explained above, in the method for forming the impurity layer according to the present embodiment, the deep impurity layer 22 that deeply extends into a depth direction from a surface of the semiconductor substrate can be formed by just one ion implantation step without plural steps for ion implantation or for a long-lasting thermal diffusion. Accordingly, the deep impurity layer can be formed in a short period of time.

Further, according to the grating mask 10 according to the present embodiment, the resist layer 18 including the thin film region 17 for forming the deep impurity layer 22 can be formed by only one ion implantation, exposure and developing process respectively.

Here, the semiconductor substrate 15 including the deep impurity layer 22 is referred to as substrates in the present application. In this respect, the aforementioned embodiment can be applied to any process for forming a deep impurity layer in the substrate.

Hereinafter, embodiments in which the aforementioned method for forming the impurity layer and the grating mask are adapted to a method for producing a solid-state imaging device will be explained.

First Embodiment

Figure 10:
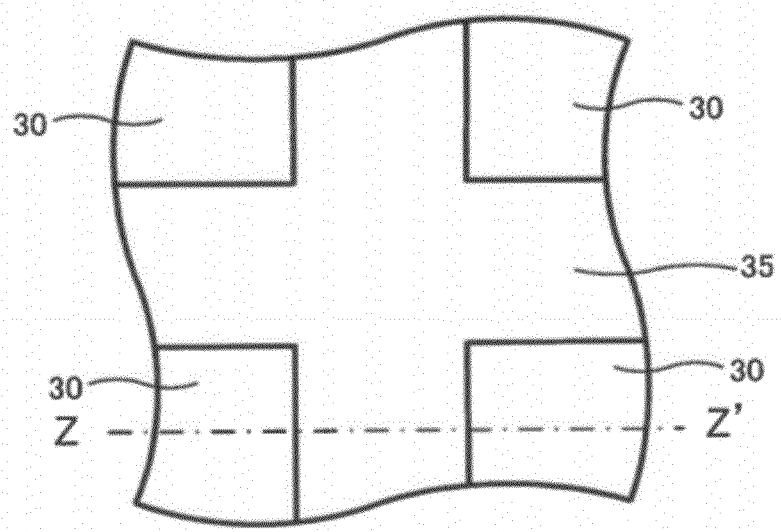
FIG. 10 is a top view showing a pixel section of a solid-state imaging device produced by the method for producing a solid-state imaging device of a first embodiment of the present invention in an enlarged manner.

FIG. 10 is a top view schematically showing a pixel section of a CMOS solid-state imaging device produced by adapting the aforementioned method for forming the impurity layer and the grating mask in an enlarged manner. As shown in FIG. 10, the pixel section is composed of a plurality of pixels 30 arranged with an alignment of a matrix. Each of these pixels 30 is composed of a photoelectric conversion section, a micro lens, etc. being stacked. Note that, there may be a case where a wiring layer, a planar layer, a color filter, etc. are formed between the photoelectric conversion section and the micro lens.

Figure 11:
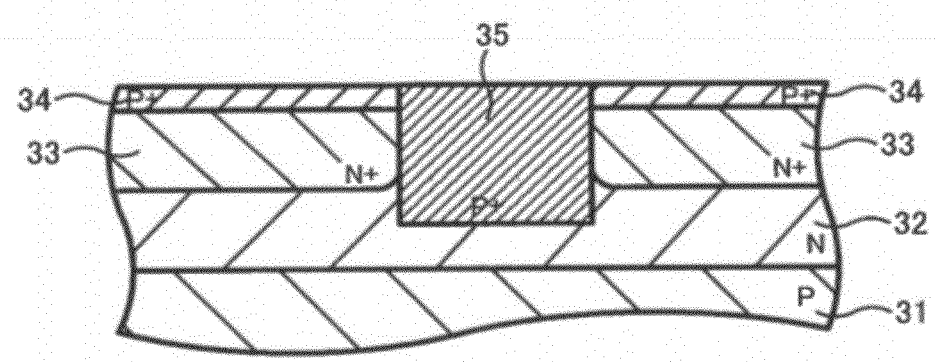
FIG. 11 is a cross sectional view along a dashed line Z-Z' in FIG. 10.

FIG. 11 is a cross sectional view along a dashed line Z-Z' in FIG. 10. As shown in FIG. 11, the pixel section of the CMOS solid-state imaging device is formed on a p-type silicon substrate 31. That is, on a surface of the p-type silicon substrate 31, an n-type base layer 32 is formed, and on a surface of this base layer 32, a plurality of photoelectric conversion sections 33 composed of an n+-type impurity layer is arranged with an alignment of a matrix. Each of the photoelectric conversion sections 33 is formed e.g. such that it is spaced apart from all of adjacent photoelectric conversion sections 33 on its four sides by about 5 to 6 μm.

Each of the photoelectric conversion sections 33 is a region that generates electrons at an amount corresponding to an amount of light focused onto this region by the micro lens (not shown). Note that, the electrons generated in each of the photoelectric conversion sections 33 are transferred to an electric charge transmitting section (not shown) formed on the p-type silicon substrate 31, and the electric charge transmitting section (not shown) transfers the electrons to an electric charge/voltage converting section (not shown) provided at a final stage thereof.

On a surface of each photoelectric conversion section 33, a p-type barrier layer 34 is formed, respectively. This barrier layer 34 is an impurity layer for controlling crystal defects from outside. A generation of a dark current is suppressed by providing this layer 34. Accordingly, the barrier layer 34 is preferably provided. However, it may not necessarily be formed.

Further, between each of aforementioned photoelectric conversion sections 33, a p-type pixel isolation layer 35 is formed. The pixel isolation layer 35 is formed so as to have a substantially uniform density distribution to a position that is at least deeper than the photoelectric conversion sections 33. This pixel isolation layer 35 is an impurity layer for suppressing the electrons to move between adjacent photoelectric conversion sections 33. Accordingly, the pixel isolation layer 35 is formed having ion density that form a potential shallower than a potential formed by the photoelectric conversion sections 33.

Although a wiring layer, a planar layer, a color filter layer, micro lens, etc. are actually formed in a stack on the photoelectric conversion section 33 thereby forming the pixels 30, indication in the drawings and explanations will herein be omitted.

The CMOS solid-state imaging device as explained above is an advantageous configuration in that it is able to effectively collect the electrons generated in the photoelectric conversion sections 33, compared to a CMOS solid-state imaging device in which a p-type base layer is formed on a surface of an n-type silicon substrate, and on a surface of this p-type base layer, a plurality of photoelectric conversion sections composed of an n-type impurity layer is arranged with an alignment.

Next, a method for producing the aforementioned solid-state imaging device will be explained with reference to FIGS. 12 to 16. FIGS. 12 to 16 excluding FIG. 14 are cross sectional views corresponding to FIG. 11. Further, FIG. 14 is an enlarged top view showing a part of a grating mask used in the method for producing the solid-state imaging device.

Figure 12:
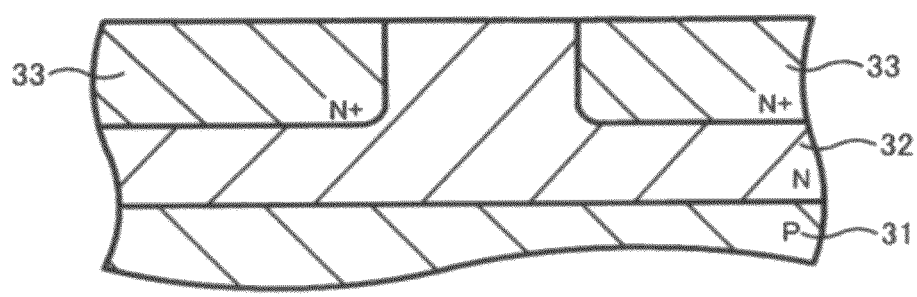
FIG. 12 is a cross sectional view corresponding to FIG. 11 showing a step of forming a photoelectric conversion section according to the first embodiment.

As shown in FIG. 12, the n-type base layer 32 is formed on the surface of the p-type silicon substrate 31, and the n-type photoelectric conversion sections 33 are formed on the surface of the base layer 32. The n-type base layer 32 is made of silicon, for example, by epitaxial growth on the surface of the p-type silicon substrate 31. Further, the n+-type photoelectric conversion sections 33 are formed by forming a resist layer, in which regions for forming the photoelectric conversion sections are opened, on the surface of the base layer 32, and implanting n-type ions such as phosphorus (P) or arsenic (As), etc. using the resist layer as a mask.

Figure 13:
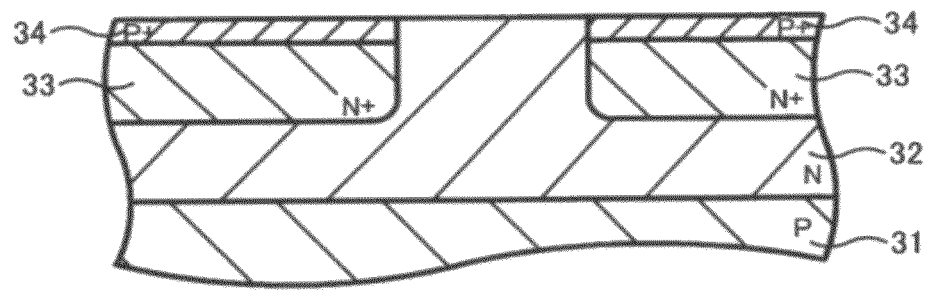
FIG. 13 is a cross sectional view corresponding to FIG. 11 showing a step of forming a barrier layer according to the first embodiment.
Figure 14:
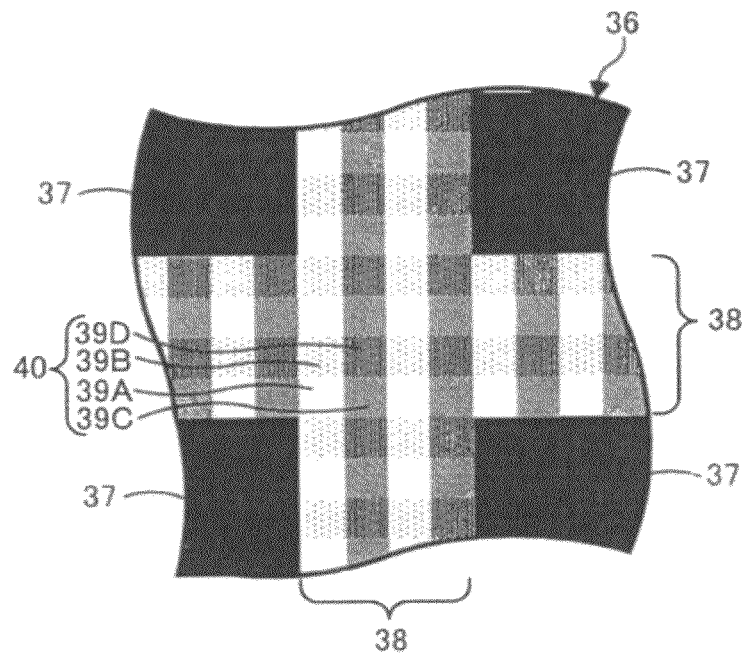
FIG. 14 is an enlarged top view showing a part of the grating mask used in the method for producing the solid-state imaging device according to the first embodiment.

Next, as shown in FIG. 13, the p-type barrier layer 34 is formed on the surface of each photoelectric conversion section 33. The barrier layer 34 is formed by implanting p-type ions e.g. such as boron (B), etc. using the aforementioned resist layer after having formed the photoelectric conversion sections 33.

Thereafter, the p+-type pixel isolation layer 35 that is an impurity layer having a larger depth than the photoelectric conversion sections 33 is formed between respective photoelectric conversion sections 33. With respect to the pixel isolation layer 35, the aforementioned method for forming the impurity layer is adapted. Thus, first, a grating mask adapted for forming the pixel isolation layer 35 will be explained with reference to FIG. 14.

As shown in FIG. 14, a grating mask 36 used for forming the pixel isolation layer 35 has non-light transmission regions 37 arranged in a matrix, and a light transmission region 38 having different transmittance depending on positions thereof formed between these non-light transmission regions 37.

Similar to the grating mask 10 shown in FIG. 1, the light transmission region 38 is a region in which a plurality of unit light transmission regions 40 is arranged in a matrix each having four minute square partial regions. Specifically, a first light transmission partial region 39A, a second light transmission partial region 39B, a third light transmission partial region 39C and a fourth light transmission partial region 39D form an unit light transmission region 40. The transmittance of the first to the fourth light transmission partial region 39A, 39B, 39C and 39D decreases in this order. Here, the arrangement of the plurality of unit light transmission regions 40 is similar to the arrangement of the unit light transmission regions 14 in the grating mask 10 shown in FIG. 1.

Figure 15:
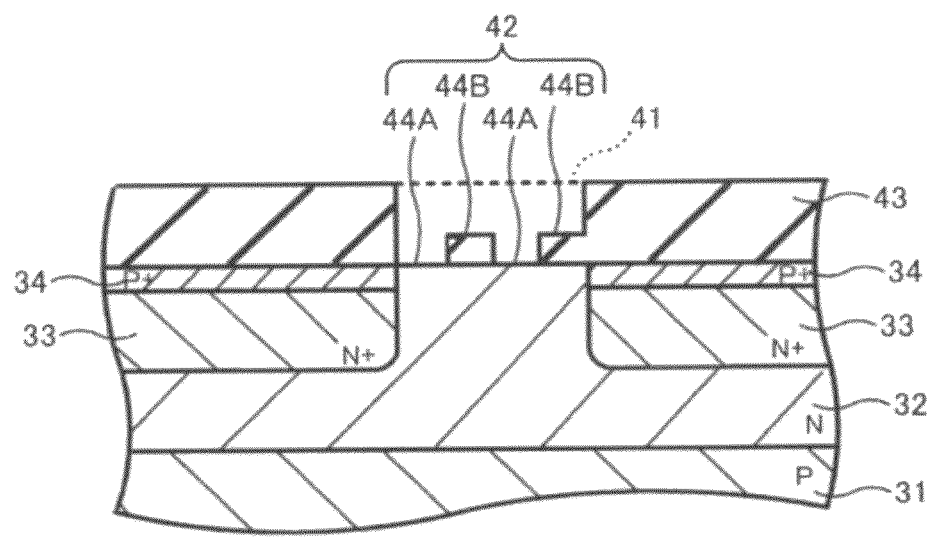
FIG. 15 is a cross sectional view corresponding to FIG. 11 showing a step of forming the resist layer according to the first embodiment.

The pixel isolation layer 35 is formed by using the grating mask 36 shown in FIG. 14. That is, as shown in FIG. 15, a photosensitive resist material is formed on the surface of the base layer 32 including the photoelectric conversion sections 33 and the barrier layers 34. Then, after having positioned the grating mask 36 as shown in FIG. 14 such that the non-light transmission regions 37 are positioned above the photoelectric conversion sections 33, the resist material 41 is exposed via the grating mask 36. Thereafter, the resist material 41 is developed. Thus, a resist layer 43 including a thin film region 42 is formed on the surface of the base layer 32, which is composed of a plurality of thin film partial regions having four different film thicknesses corresponding to the transmittance of the light transmission region 38 of the grating mask 36. The plurality of thin film partial regions are formed such that the film thicknesses differ at four levels e.g. within a range from about 0 μm to 1.5 μm.

In FIG. 15, thin film partial regions 44A, 44B having two different levels of film thicknesses including 0 μm are formed in the thin film region 42. However, in the actual thin film region 42, thin film partial regions with two other different levels of film thicknesses are formed in a perpendicular direction to a sheet plain where FIG. 15 is drawn.

Figure 16:
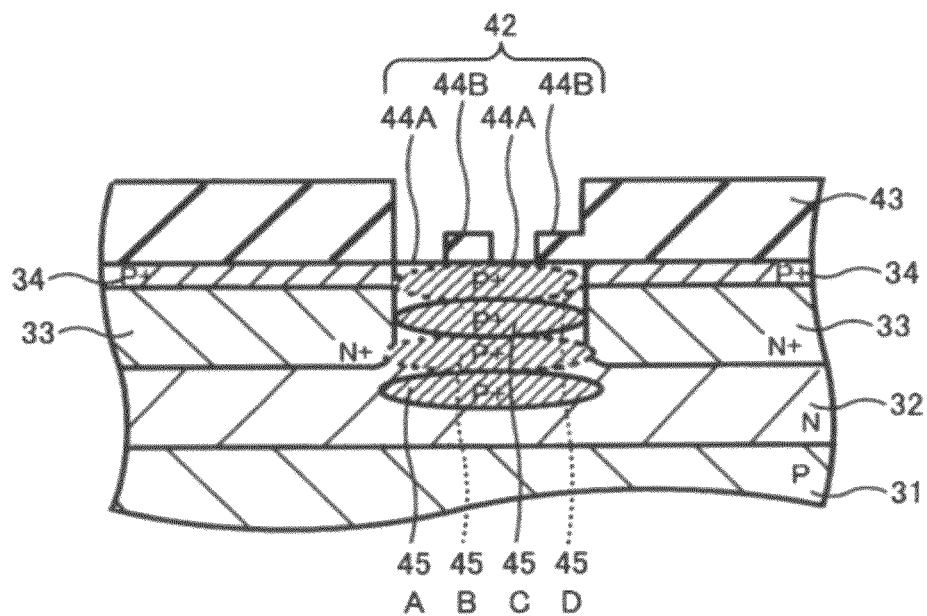
FIG. 16 is a cross sectional view corresponding to FIG. 11 showing a step of forming the pixel isolation layer according to the first embodiment.

Next, p-type ions (e.g., boron (B)) are implanted into the base layer 32 via the resist layer 43 at e.g. an acceleration voltage of about 1400 kV, as shown in FIG. 16. When the ions are implanted and are diffused in the horizontal direction thereafter, four impurity regions having peak densities at different depth. That is, a first impurity region 45A, a second impurity region 45B, a third impurity region 45C and a fourth impurity region 45D are formed corresponding to the film thicknesses of the thin film region 42 at depths decreasing in this order.

Accordingly, the first impurity region 45A, the second impurity region 45B, the third impurity region 45C and the fourth impurity region 45D formed between the photoelectric conversion sections 33 diffuse also in the vertical direction, respectively. Thus, by implanting the ions to the base layer 32 as aforementioned, consequently, the deep pixel isolation layer 35 that is deeper than the photoelectric conversion sections 33 as shown in FIG. 11 is formed.

Here, having formed the first impurity region 45A, the second impurity region 45B, the third impurity region 45C and the fourth impurity region 45D, the thermal treatment may be performed, and the pixel isolation layer 35 as shown in FIG. 11 can be formed. Thus, the time of the thermal treatment for thermally diffusing the ions can be a very short period of time, since the ion implantation in the base layer 32 is performed in a predetermined manner such that the density peaks are created in the depth direction.

As explained above, the CMOS solid-state imaging device is produced by forming the wiring layer, the planar layer, the color filter layer and the micro lens, etc. appropriately after having formed the pixel isolation layer 35 as described above.

On the other hand, a pixel isolation layer similar to the aforementioned pixel isolation layer 35 is formed by conventional method for forming the impurity layer as follows.

A resist layer in which reforming the photoelectric conversion sections are opened is formed on the surface of the base layer, and p-type ions (e.g., boron (B)) are implanted into the base layer using this resist layer as a mask. In order to create a plurality of density peaks in the depth direction, plural times of ion implantation (e.g. four times) are performed while changing the acceleration voltage for the ions within a range e.g. from 300 kW to 1400 kW. Thus, the pixel isolation layer similar to the aforementioned pixel isolation layer 35 is formed. Then thermal treatment may be performed to thermally diffuse the implanted ions. However, a time for the thermal treatment may be a short period of time, as in the case of the present embodiments.

As explained above, According to the method for producing the solid-state imaging device described as embodiments, the pixel isolation layer 35 which has a deep impurity layer can be formed in a short period of time, since the number of ion implantation can be significantly reduced compared to the conventional method for production. Accordingly, the method for producing the solid-state imaging device can improve the throughput of the production.

Second Embodiment

Figure 17:
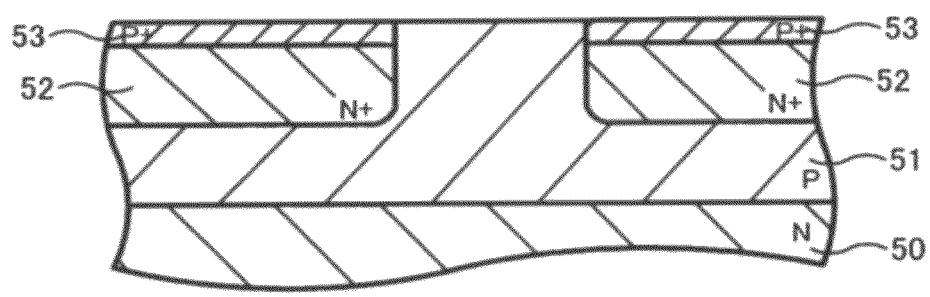
FIG. 17 is an enlarged cross sectional view corresponding to FIG. 11 showing a pixel section of a solid-state imaging device produced by the method for producing a solid-state imaging device according to a second embodiment of the present invention.

FIG. 17 is an enlarged cross sectional view corresponding to FIG. 11 schematically showing a pixel section of a CCD solid-state imaging device produced by adapting the method for forming the impurity layer. Since the top view of the pixel section of the solid-state imaging device is similar to FIG. 10, indication in the drawings and explanations will herein be omitted.

As shown in FIG. 17, the pixel section of the CCD solid-state imaging device is formed on an n-type silicon substrate 50. That is, on a surface of the n-type silicon substrate 50, a p-type well layer 51 is formed in a region from the surface of the substrate 50 to a deep portion. The p-type well layer 51 is formed to have a surface area e.g. from about 60 to 70% relative to a surface area of the silicon substrate 50. On a surface of this well layer 51, a plurality of photoelectric conversion sections 52 composed of an n+-type impurity layer is arranged with an alignment of being apart from one another. Further, on a surface of each photoelectric conversion section 52, a p-type barrier layer 53 is formed, respectively.

Here, although a wiring layer, a planar layer, a color filter layer, a micro lens and others are actually stacked on the photoelectric conversion sections 52, and thereby forming pixels, indication in the drawings and explanations will herein be omitted.

In this solid-state imaging device, the sensitivity of the pixels depends on the ion density of the p-type well layer 51. Especially, the depth of the well layer 51 depends on the sensitivity on a long wavelength side of the pixels. Accordingly, the well layer 51 for the solid-state imaging device is deep enough to obtain desired pixel sensitivity and is formed with a deep ion density.

In the case of the CCD solid-state imaging device as explained above, the electrons generated in each of the photoelectric conversion sections 52 are transferred to an electric charge transmitting section (not shown) composed of CCD formed on the n-type silicon substrate 50, and the electric charge transmitting section (not shown) transfers the electrons to an electric charge/voltage converting section (not shown) provided at a final stage thereof.

Figure 18:
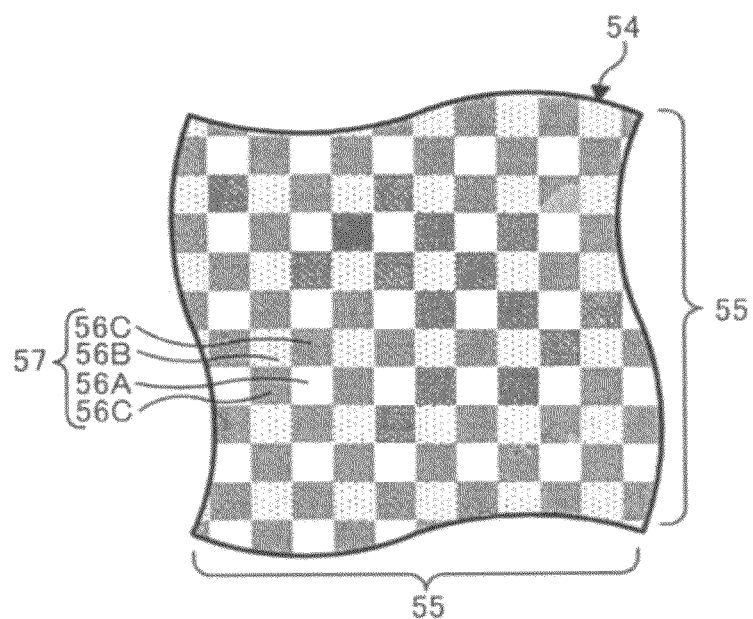
FIG. 18 is an enlarged top view showing a part of a grating mask used in the method for producing the solid-state imaging device of the second embodiment.
Figure 19:
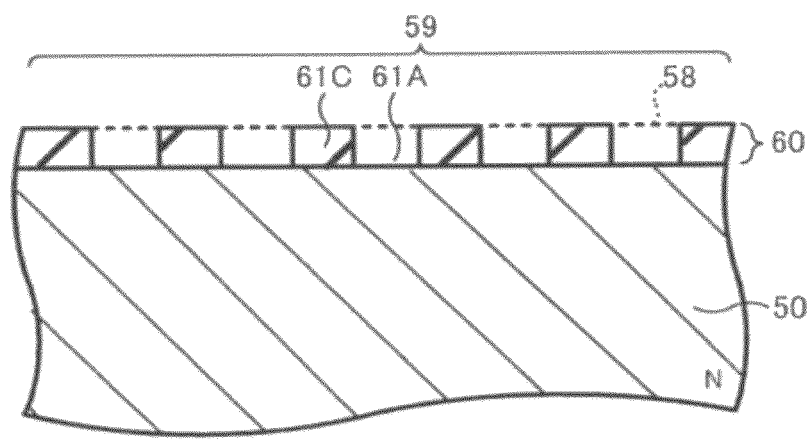
FIG. 19 is a cross sectional view corresponding to FIG. 17 showing a step of forming a resist layer according to the second embodiment.
Figure 20:
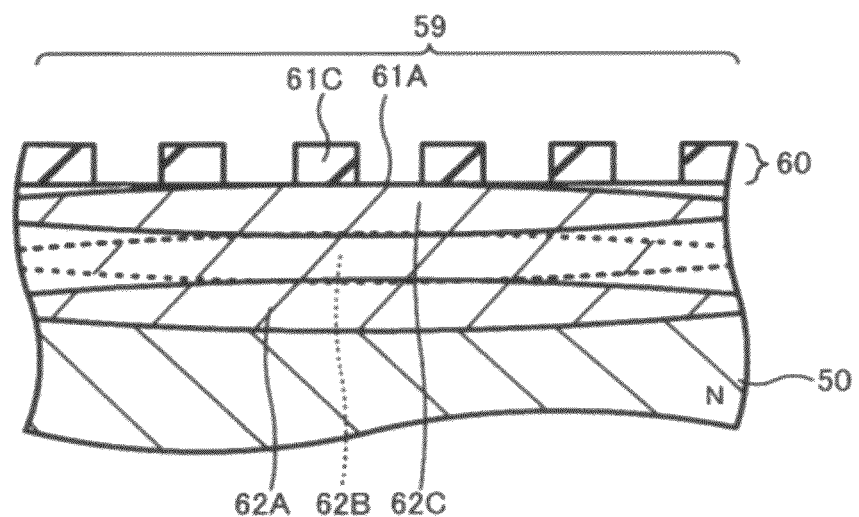
FIG. 20 is a cross sectional view corresponding to FIG. 17 showing a step of forming a well layer according to the second embodiment.
Figure 21:
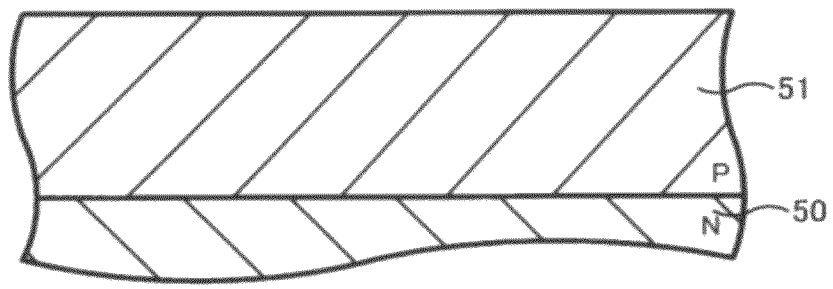
FIG. 21 is a cross sectional view corresponding to FIG. 17 showing the step of forming the well layer according to the second embodiment.

Next, a method for producing the aforementioned CCD solid-state imaging device will be explained with reference to FIGS. 18 to 21. Further, FIG. 18 is an enlarged top view showing a part of a grating mask 54 used in the method for producing the solid-state imaging device. FIGS. 19 to 21 are cross sectional views corresponding to FIG. 17 for explaining the method for producing the solid-state imaging device of the present embodiment.

In the case of the CCD solid-state imaging device, it is produced by forming the p-type well layer 51 on the surface of the n-type silicon substrate 50 in a region from the surface to the deep portion of the substrate 50, and producing photoelectric conversion sections 52, and the like on a surface portion of the well layer 51. In this method for producing the solid-state imaging device, the method for forming the impurity layer is adapted to form the well layer 51. Thus, a grating mask 54 for forming the well layer 51 will be explained with reference to FIG. 18.

As shown in FIG. 18, the grating mask 54 for forming the well layer 51 has a plane of a shape corresponding to a plane of the well layer 51, in which a light transmission region 55 having different transmittance depending on positions therein being surrounded by a non-light transmission region (not shown).

The light transmission region 55 is a region in which a plurality of unit light transmission regions having four minute square partial regions is arranged as one unit light transmission region 57.

The four minute square partial regions are composed of a first light transmission partial region 56A, a second light transmission partial region 56B and two third light transmission partial regions 56C. The transmittance of these partial regions increases in this order. Further, in the unit light transmission regions 57, these first to third light transmission partial regions 56A, 56B and 56C are arranged such that the light transmission partial regions having the same light transmittance are not arranged adjacent to each other both in the vertical and the lateral direction.

In the light transmission region 55, the unit light transmission regions 57 as explained above are so arranged that the partial regions having the same transmittance are not arranged adjacent to each other.

The well layer 51 is formed by the grating mask 54 shown in FIG. 18. That is, as shown in FIG. 19, a photosensitive resist material 58 is formed on the surface of the n-type silicon substrate 50. Then, having the grating mask 54 so positioned that the light transmission region 55 is placed at a desired position, the resist material 58 is exposed via the grating mask 54. Thereafter, the resist material 58 is developed. Thus, a resist layer 60 is formed on the surface of the silicon substrate 50, which includes a thin film region 59 composed of a plurality of thin film partial regions having three different levels of film thickness corresponding to the transmittance of the light transmission region 55 of the grating mask 54. The plurality of thin film partial regions is formed such that the film thickness differs at three levels within a range from about 0 µm to 1.7 µm.

In FIG. 19, a first thin film partial region 61A and a third thin film partial region 61C having two different levels of film thicknesses including 0 µm are formed in the thin film region 59. However, in the actual thin film region 59, thin film partial regions with other different levels of film thicknesses are formed in the vertical direction from a sheet plane where FIG. 19 is drawn. That is, the third thin film partial regions 61C having a thick film thickness are formed at a portion closest to a first thin film partial region 61A having a film thickness of 0 µm in the vertical direction from a sheet plane where FIG. 19 is drawn; and second thin film partial regions having an intermediate film thickness between the first thin film partial region 61A and the third thin film partial region 61C (not shown) are formed at a portion closest to the third thin film partial regions 61C in the vertical direction from a sheet plane where FIG. 19 is drawn.

Here, a twice the number of the third thin film partial regions 61C as the number of the first thin film partial region 61A or the second thin film partial regions are formed at in the thin film region 59.

Next, p-type ions (e.g., boron (B)) are implanted into the substrate 50 via the thin film region 59 at e.g. an acceleration voltage of about 2000 kV as shown in FIG. 20. When the ions are implanted, three impurity regions, a first impurity region 62A, a second impurity region 62B and a third impurity region 62C are formed each having peak densities at different depths by diffusion of the ions in the horizontal direction. The depth of each impurity regions 62A, 62B and 62C decreases in this order. Here, the third impurity region 62C formed by a group of ions that had penetrated the third thin film partial region 61C has an ion density of twice an ion density as mach as the first impurity region 62A or the second impurity region 62B formed by a group of ions that had penetrated the first or second thin film partial region 61A.

Further, having formed the respective impurity regions 62A to 62C, a thermal treatment may be performed e.g. for about 10 hours, so that the implanted ions are thermally diffused. Thus, a deep well layer 51 can be formed as shown in FIG. 21.

Having formed the well layer 51 as described above, the CCD solid-state imaging device is produced by forming photoelectric conversion sections 52 and barrier layers 53 on a surface portion of the well layer 51, and by further forming a wiring layer, a planar layer, a color filter layer and a micro lens, and the like appropriately.

On the other hand, the conventional method for forming the impurity layer and a well layer similar to the aforementioned well layer 51 is as follows.

That is, a resist layer in which a region for forming the well layer is opened is formed on a surface of a silicon substrate, and p-type ions (e.g., boron (B)) are implanted therein at e.g. an acceleration voltage of about 100 kV using the resist layer as a mask. Thereafter, the implanted ions are thermally diffused for about 30 hours. Thus, a well layer similar to the aforementioned well layer 51 is formed.

Figure 22:
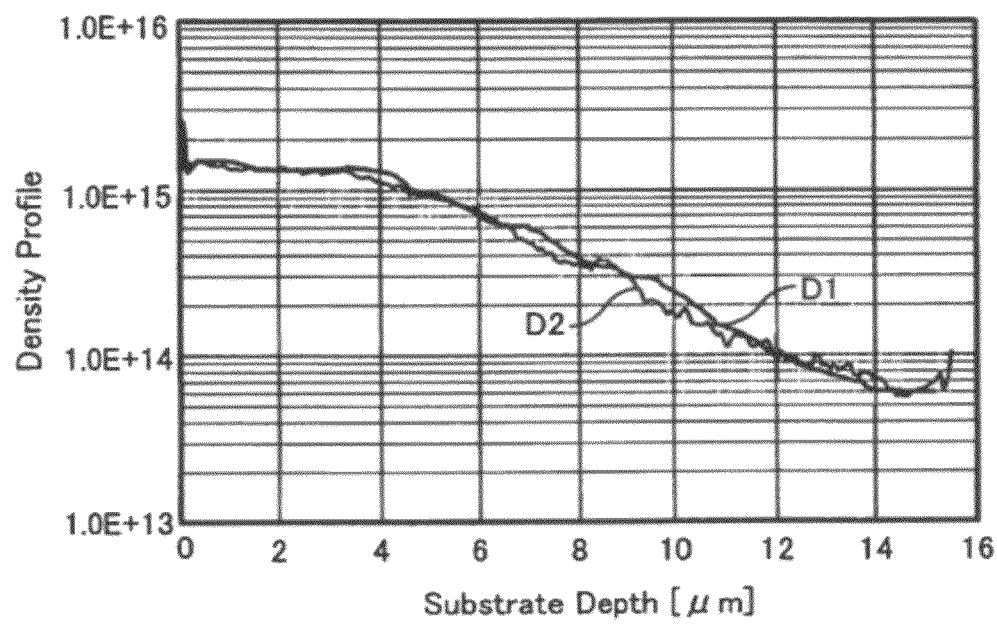
FIG. 22 is a graph comparatively showing a density profile of the well layer produced by the method for producing the solid-state imaging device of the second embodiment and a density profile of a well layer produced by a conventional method for producing a solid-state imaging device.

Now, a density profile of the well layer 51 produced by the method for producing the impurity layer and a well layer according to the present embodiment by adapting the aforementioned condition and a density profile of the well layer produced by the conventional method for producing the impurity layer by adapting the aforementioned condition are shown in FIG. 22. As shown in FIG. 22, it can be understood that the density profile of the well layer 51 produced by the method of the present embodiment (solid line D1 in the figure) substantially coincide with the density profile of the well layer produced by the conventional method for producing the impurity layer (solid line D2 in the figure).

Figure 23:
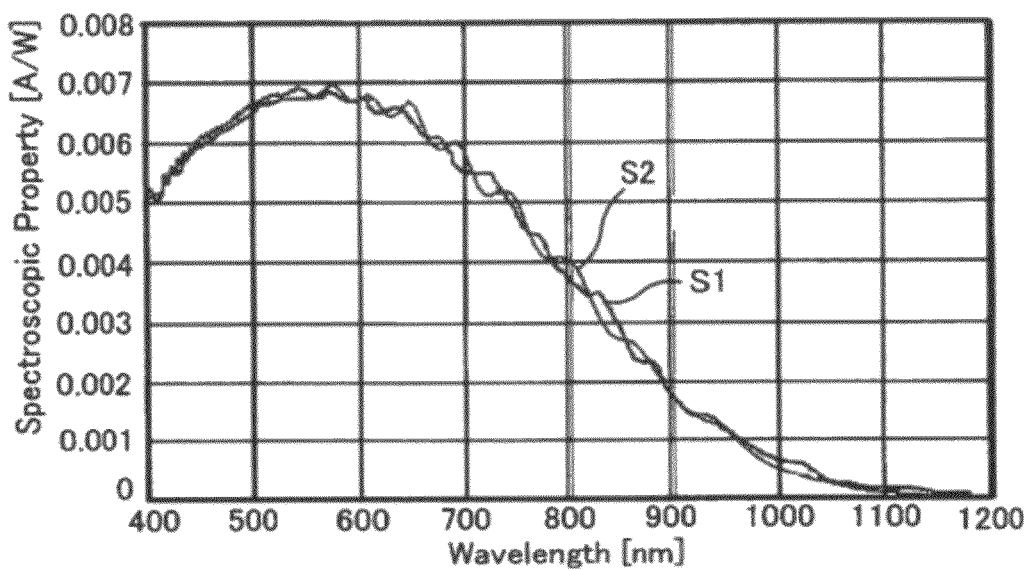
FIG. 23 is a graph comparatively showing a spectroscopic property of a device produced by the method for producing the solid-state imaging device of the second embodiment and a spectroscopic property of a device produced by the conventional method for producing the solid-state imaging device.

Further, a spectroscopic property of the solid-state imaging device including the well layer 51 formed by adapting the aforementioned condition according to the method of the present embodiment and a spectroscopic property of the solid-state imaging device including the well layer formed by adapting the aforementioned condition according to the conventional method are shown in FIG. 23. As shown in FIG. 23, it can be understood that the spectroscopic property of the solid-state imaging device formed by the method of the present embodiment (solid line S1 in the figure) substantially coincides with the spectroscopic property of the solid-state imaging device formed by the conventional method (solid line S2 in the figure).

As explained above, according to the method for producing the solid-state imaging device according to the present embodiment, the time required for implanting a plurality of impurity regions having ion peak densities at different depths is dramatically decreased as well as the time for subsequent thermal diffusion. Accordingly, as are clear from FIG. 22 and FIG. 23, the well layer 51 that is substantially identical to the well layer formed by the conventional method f can be formed in a short period of time. Thus, the method for producing the solid-state imaging device that can improve the throughput is provided according to the embodiments described.

As described above, the method for forming the impurity layer and the solid-state imaging device can form a deep impurity layer 22 such as the pixel isolation layer 35 or the well layer 51 having about the same ion density distribution produced by the conventional technique in a shorter period of time than by the conventional technique. According to the present embodiments, however, the ion densities of the impurity layer 22 at different depths can be controlled in the same production time by appropriately controlling the number of the light transmission partial regions in the unit light transmission regions 14, 40 or 57 of the grating masks 10, 36 or 54 and alignment thereof. Hereinafter, a method for producing a solid-state imaging device including a well layer 60 in which the ion density is controlled so as to improve the pixel sensitivity will be explained as a third embodiment.

Third Embodiment

The method for producing the solid-state imaging device according to a third embodiment is a method for producing a well layer in which the ion density in a deep portion is so controlled as to improve the pixel sensitivity, compared to the method for producing the solid-state imaging device of the second embodiment. Accordingly, the solid-state imaging device produced by the method for producing the solid-state imaging device according to the present embodiment is identical to those in FIG. 10 and FIG. 17 except for the ion density in the well layer 60 being different.

Figure 24:
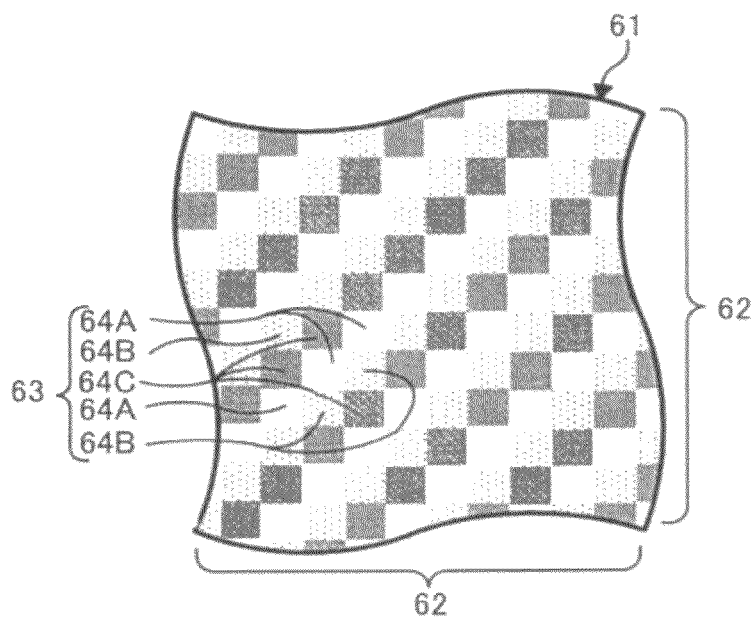
FIG. 24 is a top view showing a part of a grating mask used in a method for producing a solid-state imaging device according to a third embodiment in an enlarged manner.
Figure 25:
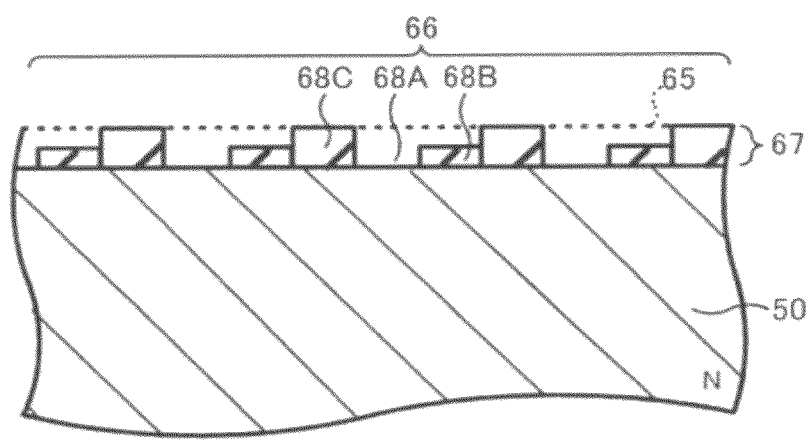
FIG. 25 is a cross sectional view corresponding to FIG. 17 showing a step of forming a resist layer according to the third embodiment.
Figure 26:
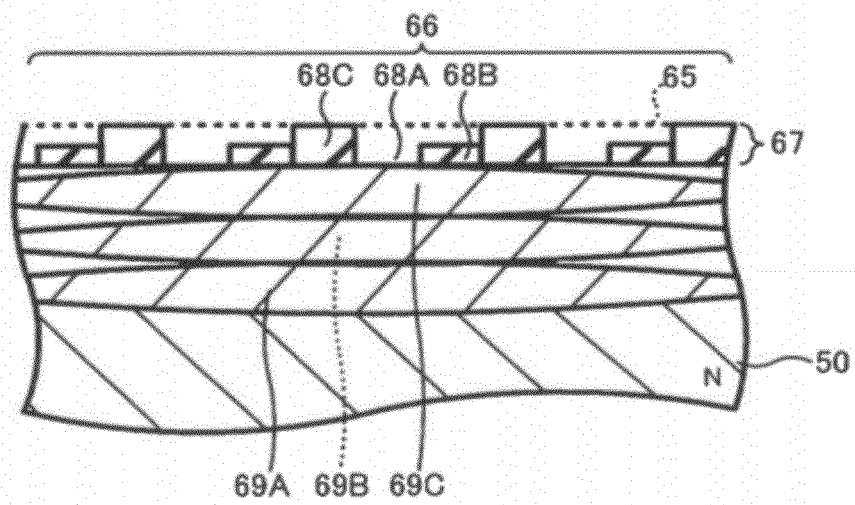
FIG. 26 is a cross sectional view corresponding to FIG. 17 showing a step of forming a well layer according to the third embodiment.
Figure 27:
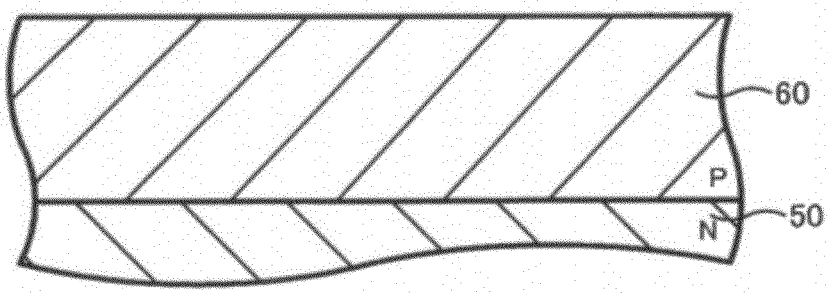
FIG. 27 is a cross sectional view corresponding to FIG. 17, similarly showing the step of forming the well layer according to the third embodiment.

Hereinafter, the third embodiment will be explained with reference to FIGS. 24 to 27. FIG. 24 is an enlarged top view showing a part of a grating mask 61 used in the method. Further, FIGS. 25 to 27 are cross sectional views corresponding to FIG. 17 for explaining the method of the present embodiment.

The grating mask 61 shown in FIG. 24 has a shape corresponding to a planar shape of the well layer 60, in which a light transmission region 62 having different transmittance depending on positions therein being surrounded by a non-light transmission region (not shown).

The light transmission region 62 is a region in which a plurality of unit light transmission regions having nine minute square partial regions is arranged as one unit light transmission region 63.

The nine minute square partial regions are composed of three first light transmission partial regions 64A, three second light transmission partial region 64B and three third light transmission partial regions 64C. The transmittance of the partial regions 64A, 64B and 64C increases in this order. Further, in the unit light transmission regions 63, these first to third light transmission partial regions 64A, 64B and 64C are arranged such that the light transmission partial regions having identical transmittance are not adjacently arranged in the vertical and the lateral direction.

In the light transmission region 62, the unit light transmission regions 63 as explained above are arranged with an alignment in which the partial regions having the same transmittance are not arranged adjacent one another.

That is, compared to the grating mask 54 shown in FIG. 18, the grating mask 61 shown in FIG. 24 differs in that a ratio of the number of the first light transmission partial regions 64A and the second light transmission partial regions 64B relative to the third light transmission partial regions 64C in the unit light transmission region 63 has increased.

The well layer 60 in which the ion density is controlled so as to improve the pixel sensitivity is formed by using the grating mask 61 as shown in FIG. 24. That is, as shown in FIG. 25, a photosensitive resist material 65 is formed on the surface of the n-type silicon substrate 50. Then, after having positioned the grating mask 61 as shown in FIG. 24 such that the light transmission region 62 is positioned at a desired position, the resist material 65 is exposed via the grating mask 61.

Thereafter, the resist material 65 is developed. Thus, a resist layer 67 including a thin film region 66 composed of a plurality of thin film partial regions having three different levels of film thickness corresponding to the transmittance of the light transmission region 62 of the grating mask 61 is formed on the surface portion of the silicon substrate 50. The plurality of thin film partial regions are formed such that the film thickness differ e.g. at three levels within a range from about 0 μm to 1.7 μm.

Here, FIG. 25 only shows an arbitrary column of a thin film region 66 in which one column is composed of a first thin film partial region 68A, a second thin film partial region 68B and a third thin film partial region 68C having three different levels of film thickness (here, the first to the third thin film partial region 68A, 68B and 68C increases in this order). However, in other columns in the thin film region 66, the first to the third thin film partial region 68A, 68B and 68C are arranged corresponding to the transmittance of the light transmission region 62 of the grating mask 61.

Here, the first to the third thin film partial region 68A, 68B and 68C are formed at the same number, respectively in the thin film region 66.

That is, compared to the grating mask 59 shown in FIG. 19, a ratio of the number of the first light transmission partial regions 68A and the second light transmission partial regions 68B relative to the third light transmission partial regions 68C has increased in the thin film region 66.

Next, p-type ions (e.g., boron (B)) are implanted into the substrate 50 via the thin film region 59 at e.g. an acceleration voltage of about 2000 kV as shown in FIG. 26. When the ions are implanted, three impurity regions, a first impurity region 69A, a second impurity region 69B and a third impurity region 69C are formed each having peak densities at different depths by diffusion of the ions in the horizontal direction. The depth of each impurity regions 69A, 69B and 69C decreases in this order.

Here, the impurity density in the first impurity regions 69A or the second impurity regions 69B are increased compared to the first impurity region 62A and the second impurity region 62B shown in FIG. 20 since the ratio of the number of the first thin film partial regions 68A or the second thin film partial regions 68B relative to the number of the third thin film partial regions 68C is increased compared to the thin film region 59 shown in FIG. 19.

Further, having formed the respective impurity regions 69A to 69C, a thermal treatment is performed e.g. for about 10 hours, and the implanted ions are thermally diffused. Thus, a deep well layer 60 can be formed as shown in FIG. 27.

Figure 28:
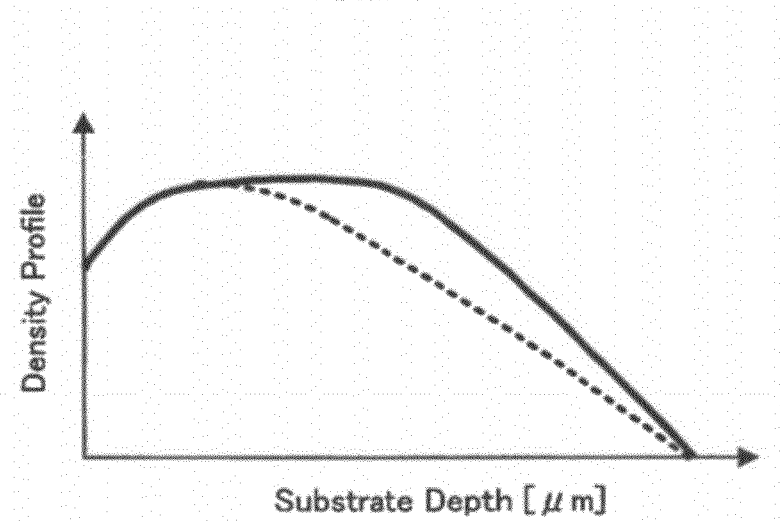
FIG. 28 is a graph comparatively showing an ion density profile of the well layer produced by the method for producing the solid-state imaging device according to the third embodiment and the ion density profile of the well layer produced by the method for producing the solid-state imaging device according to the second embodiment.

FIG. 28 is a graph comparatively showing an ion density profile of the well layer 60 formed by the method of the present embodiment and the ion density profile of the well layer 51 formed by the method of the second embodiment.

As shown in FIG. 28, the well layer 60 formed by the method of the present embodiment has the ion density increased at a deep position (solid line in the figure) compared to the well layer 51 formed by the method of the second embodiment (dotted line in the figure).

After having formed the well layer 60 as described above photoelectric conversion sections 52 and barrier layers 53 are formed on a surface portion of the well layer 60. Further a wiring layer, a planar layer, a color filter layer and the micro lens and the like are appropriately formed, thereby the CCD solid-state imaging device being produced.

As explained above, according to the method for producing the solid-state imaging device according to the present embodiment, the time required for implanting a plurality of impurity regions having ion peak densities at different depths is dramatically decreased as well as the time for subsequent thermal diffusion. Thus, the method for producing the solid-state imaging device that can improve the throughput is provided produced in a short time.

Further, according to the method for producing the solid-state imaging device according to the present embodiment, the well layer 60 is formed by using the grating mask 61 that is controlled such that the ratio of the number of the first and second light transmission partial regions 64A, 64B relative to the third light transmission partial regions 64C in the unit light transmission region 63 is increased compared to the grating mask 54 used in the method for producing the solid-state imaging device in the third embodiment. Accordingly, the well layer 60 in which the ion density at a deep position is improved can be formed compared to the well layer 51 formed by using the grating mask 54. Accordingly, a solid-state imaging device can be produced in which especially the pixel sensitivity on the long wavelength side is improved compared to the solid-state imaging device produced by the method for producing the solid-state imaging device of the third embodiment.

The embodiments of the present invention have been explained in the foregoing, however, these embodiments are presented as mere examples, and there is no intention to hereby limit the scope of the invention. These new embodiments can be implemented in various other embodiments, and a variety of abbreviation, replacement and modification can be performed within a scope that does not deviate from the essence of the invention. These embodiments and variants thereof are included in the scope and essence of the invention, and are included in the inventions recited in the claims and the equivalents thereof.

For example, the aforementioned grating masks 10, 36, 54 or 61 composed the unit light transmission regions 14, 40, 57 or 63 by a plurality of light transmission partial regions respectively having three levels or four levels of different transmittance. However, the unit light transmission region only needs to be composed of two or more light transmission partial regions having different transmittance in two levels or more. Accordingly, the shapes of the resist units 20 formed by the respective grating mask 10, 36, 54 or 61 as aforementioned are not limited to the shape shown in FIG. 6; the resist units only needs to be composed of two or more thin film partial regions having different film thickness of two or more levels.

Further, the unit light transmission regions 14, 40, 57 or 63 were arranged two-dimensionally in the respective grating mask 10, 36, 54 or 61 as aforementioned. However, the grating mask of the embodiments of the present invention may have the unit light transmission regions 14, 40, 57 or 63 arranged at least in the column direction or the row direction.

In the description of present specification, the term of the mask or the exposure mask includes design data used to form the mask in addition to the mask itself such as the grating masks 10, 36, 54 or 61 of the embodiments described.

What is claimed is:
1. A method for forming an impurity layer comprising:
 forming a photosensitive resist material on a substrate;
 exposing the resist material using an exposure mask in which a plurality of unit light transmission regions is arranged two-dimensionally, each unit light transmission region being composed of a plurality of partial regions having different transmittance between adjacent regions;

forming a resist layer in which a film thickness is made partially different according to the transmittance of the exposure mask by developing the exposed resist material;

implanting ions to the substrate via the resist layer; and diffusing ion groups that are implanted at a substantially same depth in the substrate such that the ion groups are coupled in a lateral direction.

2. The method for forming an impurity layer according to claim 1, wherein the unit light transmission region of the exposure mask is configured by arranging the partial regions having the different transmittance in a matrix.

3. The method according to claim 2, wherein the unit light transmission region has a substantially square shape, and the partial regions are formed by dividing the unit light transmission region into four, each of which having a substantially square shape with one-fourth of an area of the unit light transmission region.

4. The method for forming an impurity layer according to claim 3, wherein the partial regions having the same transmittance are arranged apart from each other.

5. The method for forming an impurity layer according to claim 1, wherein the resist layer formed by the exposing is composed of a plurality of unit resist regions being arranged two-dimensionally, each unit resist region including a plurality of partial regions having different film thickness.

6. The method for forming an impurity layer according to claim 5, wherein the partial regions included in the unit resist region include parts having a film thickness of substantially zero.

7. The method for forming an impurity layer according to claim 1, wherein the diffusing is a thermal diffusion.

8. A method for producing a solid-state imaging device comprising:

arranging a plurality of photoelectric conversion sections in a matrix form on a surface of a base layer formed on a surface of a semiconductor substrate;

forming a photosensitive resist material on a surface of the base layer including the photoelectric conversion sections;

positioning an exposure mask composed of a plurality of non-light transmission regions arranged in a matrix form and light transmission regions arranged between the non-light transmission regions such that each of the non-light transmission regions of the exposure mask is positioned above the plurality of photoelectric conversion sections, wherein each of the light transmission regions includes a plurality of unit light transmission regions being arranged two-dimensionally, each unit light transmission region being composed of a plurality of partial regions having different transmittance between adjacent regions;

exposing the resist material using the exposure mask;

forming a resist layer in which a film thickness is made partially different according to the transmittance of the exposure mask by developing the exposed resist material;

implanting ions to intervals between the adjacent photoelectric conversion sections in the base layer via the resist layer; and forming a pixel isolation layer by diffusing ion groups that are implanted at a substantially same depth in the base layer such that the ion groups are coupled in a lateral direction.

9. The method for producing a solid-state imaging device according to claim 8, wherein the unit light transmission region of the exposure mask is composed by arranging the partial regions having the different transmittance in a matrix.

10. The method according to claim 9, wherein the unit light transmission region has a substantially square shape, and the partial regions are formed by dividing the unit light transmission region into four, each of which having a substantially square shape with one-fourth of an area of the unit light transmission region.

11. The method for producing a solid-state imaging device according to claim 8, wherein the resist layer formed by the exposing is composed of a plurality of unit resist regions being arranged two-dimensionally, each unit resist region including a plurality of partial regions having different film thickness.

12. The method for producing a solid-state imaging device according to claim 11, wherein the partial regions included in the unit resist region include parts having a film thickness of substantially zero.

13. The method for producing a solid-state imaging device according to claim 8, wherein the diffusing uses a thermal diffusion.

14. A method for producing a solid-state imaging device comprising:

forming a photosensitive resist material on a surface of a semiconductor substrate;

exposing the resist material using an exposure mask composed of a light transmission region and a non-light transmission region surrounding the light transmission region, the light transmission region including a plurality of unit light transmission regions being arranged two-dimensionally, and each unit light transmission region being composed of a plurality of partial regions having different transmittance between adjacent regions;

forming a resist layer in which a film thickness is made partially different according to the transmittance of the exposure mask by developing the exposed resist material;

implanting ions to the semiconductor substrate via the resist layer;

forming a well layer by diffusing ion groups that are implanted at a substantially same depth in the semiconductor substrate such that the ion groups are coupled in a lateral direction and regularized; and arranging a plurality of photoelectric conversion sections in a matrix form on a surface portion of the well layer.

15. The method for forming an impurity layer according to claim 14, wherein the unit light transmission region of the exposure mask is configured by arranging the partial regions having the different transmittance in a matrix.

16. The method according to claim 15, wherein the unit light transmission region has a substantially square shape, and the partial regions are formed by dividing the unit light transmission region into four, each of which having a substantially square shape with one-fourth of an area of the unit light transmission region.

17. The method according to claim 3, wherein two partial regions among the partial regions divided into four have same transmittance, and the two partial regions having the same transmittance are arranged apart from one another.

18. The method for forming an impurity layer according to claim 15, wherein the resist layer formed by the exposing is composed of a plurality of unit resist regions being arranged two-dimensionally, each unit resist region including a plurality of partial regions having different film thickness.

19. The method according to claim 15, wherein the unit light transmission region has a substantially square shape, and the partial regions are formed by dividing the unit light transmission region into nine, each of which having a substantially square shape with one-ninth of an area of the unit light transmission region.

20. The method according to claim 19, wherein three partial regions among the partial regions divided into nine have same transmittance, and the three partial regions having the same transmittance are arranged apart from one another.

21. The method for forming an impurity layer according to claim 1, wherein the transmittance of the partial regions of the unit light transmission region are different from each other.

22. The method for forming an impurity layer according to claim 1, wherein arrangement of the partial regions of the unit light transmission regions are equal between the unit light transmission regions.

23. The method for producing a solid-state imaging device according to claim 8,
wherein the transmittance of the partial regions of the unit light transmission region are different from each other.

24. The method for producing a solid-state imaging device according to claim 8,
wherein arrangement of the partial regions of the unit light transmission regions are equal between the unit light transmission regions.

25. The method for producing a solid-state imaging device according to claim 14,
wherein the transmittance of the partial regions of the unit light transmission region are different from each other.

26. The method for producing a solid-state imaging device according to claim 14,
wherein arrangement of the partial regions of the unit light transmission regions are equal between the unit light transmission regions.

* * * * *